United States Patent
Wiegner et al.

(10) Patent No.: US 7,593,703 B2
(45) Date of Patent: Sep. 22, 2009

(54) FREQUENCY SWITCH FOR MULTIBAND POWER AMPLIFIER APPLICATIONS AND MULTIBAND/MULTISTANDARD POWER AMPLIFIER MODULE

(75) Inventors: Dirk Wiegner, Schwaikheim (DE); Tobias Naβ, Stuttgart-Zuffenhausen (DE); Ulrich Seyfried, Hemmingen (DE)

(73) Assignee: Alcatel-Lucent, Paris (FR)

(*) Notice: Subject to any disclaimer, the term of this patent is extended or adjusted under 35 U.S.C. 154(b) by 458 days.

(21) Appl. No.: 11/589,826

(22) Filed: Oct. 31, 2006

(65) Prior Publication Data

US 2007/0155345 A1    Jul. 5, 2007

(30) Foreign Application Priority Data

Dec. 12, 2005   (EP) .................................. 05292694

(51) Int. Cl.
  *H04B 1/04*   (2006.01)
  *H04Q 7/20*   (2006.01)
(52) U.S. Cl. ..................................... 455/127.2; 330/126
(58) Field of Classification Search ... 455/127.1–127.4; 330/51, 126, 302
See application file for complete search history.

(56) References Cited

U.S. PATENT DOCUMENTS 3,720,888 A    3/1973 Manuali
6,501,331 B2*  12/2002 Adar ........................... 330/51
2003/0011443 A1*  1/2003 Liu et al. ..................... 333/126
2004/0183624 A1    9/2004 Liang et al.

FOREIGN PATENT DOCUMENTS

EP    0 910 132 A2    4/1999

OTHER PUBLICATIONS

R. Parkhurst et al, "Silicon Bipolar 3 V power amplifier for GSM900/GSM1800 handsets", Bipolar/Bicomos Circuits and Technology Meeting, 1998. Proceedings of the 1998 Minneapolis, MN, USA Sep. 27-29, 1998, Piscataway, NJ, USA< IEEE, Sep. 27, 1998, pp. 117-199, XP010318224.

* cited by examiner

*Primary Examiner*—Lee Nguyen
(74) *Attorney, Agent, or Firm*—Fay Sharpe LLP

(57) ABSTRACT

A frequency switch (1), in particular for use in a multiband/multistandard power amplifier module (11, 17), comprising at least two output ports, a first output port (7) being arranged within a first output path (8) and a second output port (9) being arranged within a second output path (10), said output ports (7, 9) being connected with an input port (6) via said output paths (8, 10), each output path (8, 10) being provided with at least one RF block (2a, 2b, 2c, 2d), each RF-block (2a, 2b, 2c, 2d) comprising a capacitor, (3a, 3b, 3c, 3d) a switching element (5a, 5b, 5c, 5d) and a quarterwave section, wherein for each RF-block (2a, 2b, 2c, 2d) a predetermined frequency band is selected and the length of said quarterwave section is matched to said selected frequency band in order to block incoming signals in said selected frequency band if the switching element (5a, 5b, 5c, 5d) of the corresponding RF-block (2a, 2b, 2c, 2d) is switched on. Thus a frequency switch for usage with a multiband power amplifier can be realised which allows selection of different frequency bands with reduced power loss.

14 Claims, 2 Drawing Sheets

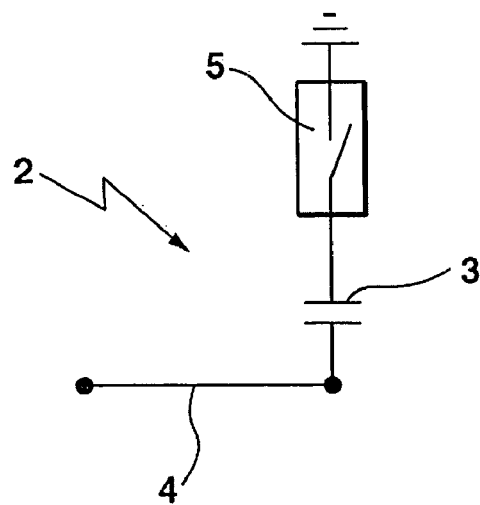
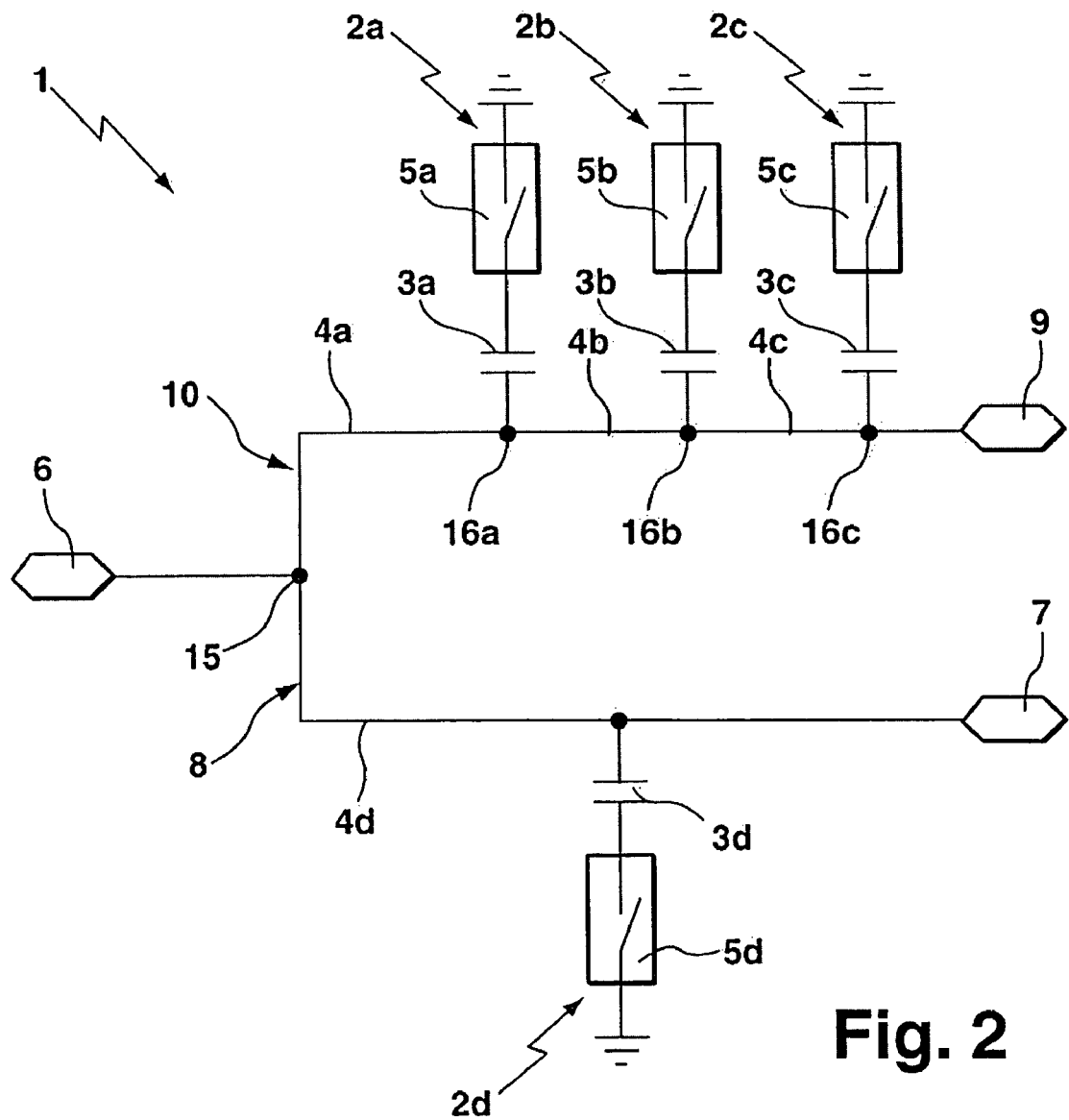

FREQUENCY SWITCH FOR MULTIBAND POWER AMPLIFIER APPLICATIONS AND MULTIBAND/MULTISTANDARD POWER AMPLIFIER MODULE

The invention is based on a priority application EP 05292694.6 which is hereby incorporated by reference.

TECHNICAL FIELD

The invention relates to a frequency switch, in particular for use in a multiband/multistandard power amplifier module. Furthermore the present invention relates to a multiband/multistandard power amplifier module in order to amplify a wide frequency bandwidth to high output power levels.

BACKGROUND OF THE INVENTION

Especially for multiband/multistandard capable power amplifier modules, which are e.g. used for software defined radio applications, different frequency bands and standards have to be covered by one single amplifier module, making high demands regarding bandwidth, output power, efficiency, costs, etc.

Currently the realisation of a described power amplifier module covering a very wide bandwidth (e.g. 800 MHz-2.7 GHz) for high output power levels is a main problem. Since the available bandwidth of a power transistor decreases with increased output power, it's very difficult or not realisable to cover the complete mentioned frequency range by a single power transistor for high output power levels.

It is known to use pre- and driver amplifier stages for amplifying signals over the complete frequency range up to medium output power levels. To reach higher output level suitable partitioning of the frequency range can be done. Thus separate power transistors can be used for the final amplifier stage, which have to cover smaller bandwidths. Partitioning of the frequency range is usually done by frequency splitters or non-frequency selective power divider as known from data sheet of Mini-Circuits "Coaxial Power Splitter/Combiner" (www.minicircuits.com). However, known frequency splitters show a very high power loss.

Furthermore it is known to use a stage-bypassing principle to address different standards with different peak-to-average signal-power ratios (PAR) in different frequency bands. For signals which require less peak output power the last amplifier stage can be bypassed and switched off.

SUMMARY OF THE INVENTION

It is an object of the present invention to provide a frequency switch for usage with a multiband/multistandard power amplifier module which allows selection of different frequency bands with reduced power loss and thus efficiency improvement.

Another objective of the invention is to provide the possibility to cover frequency bands and communication standards within a very wide frequency range up to high output power levels with improved matching of the final amplifiers.

It is also an object of the present invention to provide an multiband/multistandard power amplifier module with high output level and low power loss.

According to the first aspect of the present invention the object is achieved by means of a frequency switch comprising at least two output ports, a first output port being arranged within a first output path and a second output port being arranged within a second output path, said output ports being connected via said output paths, each output path being provided with at least one RF block, each RF-block comprising a capacitor, a switching element and a quarter-wave line section, wherein for each RF-block a predetermined frequency band is selected and the length of said quarter-wave line is matched to said selected frequency band in order to block incoming signals in said frequency band if the switching element of the corresponding RF-block is switched on.

The inventive frequency switch allows selecting different frequency bands by using a switchable Rf-block, based on a capacitor, a switching element and a quarter-wave line section, which are suitably combined. If the switching element is switched on, the quarter-wave line section in combination with the capacitor effects an inductive behaviour of the RF-block directly at a splitting node of the input port and the at least two output ports. Thus the selected frequency bands, which depend on the length of the quarter-wave line sections, are blocked directly at said splitting node for the corresponding output paths. The length of the quarter-wave line sections are chosen in a manner that it corresponds to the frequency bands to be blocked.

Different RF-blocks are preferably matched to different frequency bands. By the proposed frequency switch principle, different frequency bands which are provided with the incoming signal at the input port can be selected and transferred to different output ports.

In a preferred embodiment of the inventive frequency switch during use of said switching element at least one RF-block is switched off. For improved operation, it is recommended to switch off all RF blocks which are located within the same output path. The frequency switch is then operated in serial use. In this case power loss can be minimized down to 1 dB and better for each output port.

In an alternative embodiment during use of said switching element all RF-blocks are switched off. This parallel mode of the proposed frequency switch yields a loss of approximately 3.5 dB for each output port, which is close to the loss of conventional power splitters.

According to a second aspect of the present invention the object is achieved by a multiband/multistandard power amplifier module comprising a preamplifier stage for preamplifying an incoming signal in the total band-width up to an intermediary power level, a frequency switch according to claim 1 for blocking signals in at least one of the selected frequency bands, and a first final amplifier which is arranged after the frequency switch within a first path and is optimized to amplify signals which are blocked in the second output path of said frequency switch from said intermediary power level up to an output power level.

The first path is connected to the first output port of the frequency switch. After preamplifying the incoming signal a selected frequency band can be separated and fed to the corresponding output path, i.e. to the output path in which no RF-block for blocking the selected frequency band is provided. The selected frequency band which is blocked by the RF-block of the second output path can then be supplied to the first final amplifiers of the first path, which has to cover only a reduced frequency bandwidth. Then each final amplifier has to cover a reduced frequency bandwidth, thus supporting an improved matching regarding the above mentioned properties e.g. gain characteristic and efficiency. The inventive multiband/multistandard capable amplifier module uses the above described principle of the inventive frequency switch principle advantageously and is therefore able to cover frequency bands and radio standards within a wide frequency range (e.g. 800 MHz-2700 MHz) with low power loss.

In a preferred embodiment of the inventive multiband/multistandard power amplifier module a second final amplifier is provided, which is arranged after said frequency switch within a second path, which is connected to the second output port of the frequency switch. Thus the selected frequency band corresponding to the second RF-block can be supplied to the second final amplifier. While addressing a selected frequency band by one specific final amplifier, the other one can be switched off by setting its supply voltage to 0 V. Thus no power will be consumed by the not served frequency band. For this purpose the switching element of the frequency switch for the corresponding addressed frequency band is switched off.

It is advantageous if said first final amplifier and said second final amplifier are optimized with respect to the different selected frequency bands and show different gain, power and efficiency characteristics. Different frequency bands can be served in an optimized manner.

For example for GSM and UMTS application it may be advantageous if said first final amplifier is optimized with respect to frequencies from 1.8 GHz to 2.7 GHz and said second final amplifier is optimized with respect to frequencies from 0.8 GHz to 1.0 GHz. Yet, other applications and selected bandwidth are possible.

A highly preferred embodiment provides that the number of final amplifiers is equal to the number of output ports of said frequency switch. Each selected frequency band can then be fed to a separate optimized final amplifier.

In an alternative embodiment the number of final amplifiers is less the number of output ports of said frequency switch. This embodiment can be used for the stage-by-passing which is interesting for example for addressing different radio standards (GSM, UMTS). Since for GSM signals the final amplifier stage is not required due to reduced peak-to-average ratio (PAR) of a GSM signal, by-passing the final amplifier by providing an output port, in which the signals are not amplified, and by feeding the GSM signals to said output port, power consumption of multiband/multistandard power amplifier module can be reduced and efficiency can be increased.

A highly preferred embodiment of the inventive multiband/multistandard power amplifier module provides a second frequency switch in order to switch and/or combine the signals from said at least two output paths to a common output path. A common antenna network can then be used. In serial mode the corresponding signal is switched from the first path or the second path to the common output path. In parallel mode the signals from the first and the second path are combined.

The inventive frequency switch and multiband/multistandard power amplifier module are advantageously applied where different frequency bands have to be selected within a wide frequency range with only low power loss, since the inventive frequency switch is easy to implement and constitutes a cheap and flexible solution for improving the efficiency of a multiband/multistandard power amplifier module.

A possible application in the field of mobile radio could e.g. be a multiband/multistandard (UMTS, GSM, EDGE, WiMAX, etc.) capable power amplifier module for a software defined radio frontend.

Further advantages and characteristics of the present invention can be gathered from the following description of preferred embodiments with reference to the enclosed drawings. Features mentioned above as well as below can be used in accordance with the invention, either individually or in conjunction. The embodiments mentioned are not to be understood as an exhausted enumeration but rather as examples with regard to the underlying concept of the present invention.

BRIEF DESCRIPTION OF THE DRAWINGS

The invention is shown in the drawing
FIG. 1 shows a schematic circuit diagram of an inventive RF-block;
FIG. 2 shows a schematic circuit diagram of an inventive frequency switch.

The following detailed description of the invention refers to the accompanying drawings. Same reference numerals may be used in different drawings to identify the same or similar elements.

DETAILED DESCRIPTION OF PREFERRED EMBODIMENTS

Figure 3:
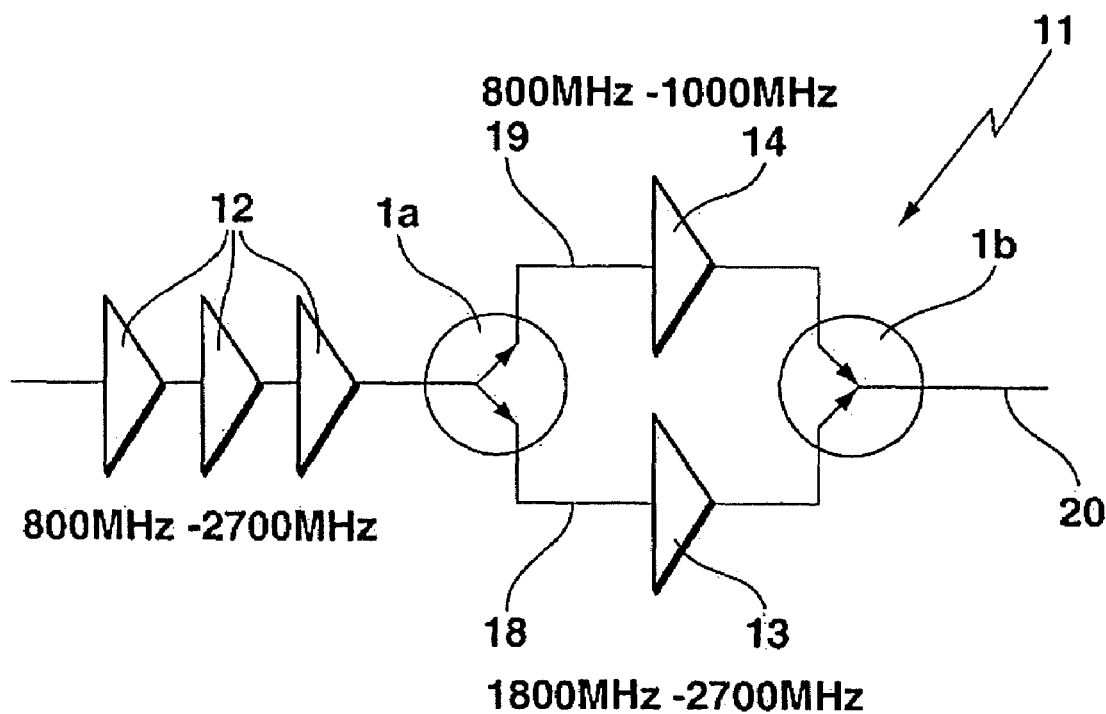
FIG. 3 shows a scheme of a first embodiment of an inventive multiband/multistandard power amplifier module.

By using a frequency switch 1 according to the present invention, an intended frequency band can be selected. The basic idea is to provide the frequency switch 1 with an RF-block 2, shown in FIG 1. A capacitor 3 in combination with a quarter-wave line sections comprising a line section 4 results into an inductive behavior of the RF-block 2, which is responsible for the RF-blocking character of the RF-block 2 concerning RF-signals of a certain frequency. By serial connection of switching element 5 (e.g. PIN-diode, RF-relay) with the capacitor 3, the RF-block 2 becomes switchable. If the switching element 5 is closed (switched on) the RF-block is active as to block signals of a predetermined frequency band which depends on the length of the quarter-wave line section 4. Therefore signals of different frequency bands can be RF-blocked by varying the length of the quarter-wave line section 4.

By combination of several quarterwave sections 4 with different quarterwave section lengths (according to different frequencies), the frequency band to be blocked can be increased. By using such switchable RF-blocks 2, for example the proposed frequency switch illustrated in FIG. 2 can be realised.

The frequency switch 1 in FIG. 2 comprises and input port 6, a first output port 7 arranged within a first output path 8 and a second output port 9 arranged within a second output path 10. Yet, the number of output ports can also be increased in order to achieve a finer resolution of the frequency band selection. In a preferred embodiment of the inventive frequency switch 1, input port 6 and output ports 7,9 are matched to 25 Ω for being used within an interstage matching. The first output path 8 is provided with one switchable RF-block 2d comprising a capacitor 3d, a quarter-wave line section and a switching element 5d, whereby the quarter-wave line section of the RF-block 2d comprises a line section 4d. The second output path 10 comprises three switchable RF-blocks 2a, 2b, 2c for an increased blocked frequency band. Each RF-block 2a, 2b, 2c comprises a capacitor 3a, 3b, 3c, a quarter-wave line section and a switching element 5a, 5b, 5c, whereby the quarter-wave line section of the RF-block 2a comprises a line section 4a, the quarter-wave line section of the RF-block 2b comprises line sections 4a and 4b, and the quarter-wave line section of the RF-block 2c comprises line sections 4a and 4b and 4c.

E.g. the frequency band to be blocked by RF-block 2b is defined by the length of the quarterwave section, which comprises line sections 4a and 4b and extends from a splitting node 15, at which the first output path 8 is connected with the second output path 10 to a further splitting node 16a to the next splitting node 16b of the second output path 10. By on-switching of the switching element 5d or switching elements 5a, 5b, 5c either the first output path 8 or the second output path 10 can be blocked (serial use).

FIG. 2 shows exemplary a first selected frequency band of the RF-block 2d comprising 800 MHz-1000 MHz and a second selected frequency band of the RF-blocks 2a, 2b, 2c, 2d comprising 1800 MHz-2700 MHz. If e.g. a signal with frequencies of 900 MHz at the input port 6 have to be transferred to the second output port 9 the switching elements 5a, 5b, 5c all have to put in off-state, while switching element 5d of the first output path 8 has to put in on-state. That means that the selected frequency band of the RF-block 2d of the first output path 8 is RF-blocked while the second output path 10 is shortened to the input port 6. A simulation of the above mentioned case (900 MHz at output port 9) shows that the power loss of the signal in the second output path 10 is approximately 0.8 dB. The first output path 8 is blocked better than 3 dB within simulated frequency band (0 GHz-4 GHz) and better than −15 dB in the selected 900 MHz band (800 MHz-1000 MHz).

For transferring signals with frequencies of 1800 MHz-2700 MHz from the input port 6 to the first output port 7, switching elements 5a, 5b, 5c all have to put in on-state, while switching element 5d of the first output path 8 has to put in off-state. Simulations show that in this case the power loss of the signal in the first output path 8 is approximately 0.5-0.7 dB, while the second output path 10 is blocked better than −4 dB within the simulated frequency band (0 GHz-4 GHz) and better −8 dB in the selected 1.8 GHz-2.7 GHz band.

It is also possible to use the first output port and the second output port parallel. For this purpose all switching elements 5a, 5b, 5c, 5d have to be set in off-state. A parallel use of the inventive switching element 1 yields simulation results nearly comparable to conventional power splitters with 3 dB loss for each output port 7,9.

Since the simulation results are based on a first design approach of the inventive frequency switch 1, further optimizations are to be expected in the future.

The required size of the inventive frequency switch 1 depends on e.g. frequencies and relative permittivity $\epsilon_r$ of the used substrate of the quarter-wave line sections 4a, 4b, 4c, 4d. Sizes of approximately 5 cm×2 cm are achieved, but the sizes can be clearly reduced by suitable arrangement of the lines.

FIG. 3 shows a scheme of an embodiment of a possible future multiband/multistandard power amplifier module 11. The inventive multiband/multistandard power amplifier module 11 comprises pre- and driver amplifier 12 for amplifying an incoming signal up to an intermediary power level. Since lower output power levels, which are required from the pre- and driver amplifier 12, are achievable for a wide bandwidth e.g. of 800 MHz-2700 MHz, the pre- and driver amplifier 12 are wideband matched covering the complete frequency range of the incoming signal. Thus the pre- and driver amplifier 12 are used in common for the complete frequency range up to a certain power level.

Due to the fact, that for high output power levels the available bandwidth of amplifier stages decreases, an inventive frequency switch 1a is used after the pre- and driver amplifier stages 12 in order to separate selected frequency bands (e.g. 800 MHz-1000 MHz and 1800 MHz-2700 MHz respectively), which are smaller compared to the full bandwidth of the incoming signal. For amplifying the separated signal from said intermediary power level up to an output power level, a first path 18 comprises a first final amplifier 13 for amplifying the signals of the first output path 8 of the switching element 1a and a second path 19 comprises a second final amplifier 14 for amplifying the signals of the second output path 10 of the switching element 1a, each final amplifier comprising at least one transistor. Both final amplifiers 13, 14 are matched to said smaller frequency bands given by the frequency switch 1a.

With this procedure, the final amplifiers 13, 14 can be matched more accurate e.g. resulting in an improved gain characteristic. In FIG. 3 the final amplifier 13 of the first path 18 serves the 1800 MHz-2700 MHz frequency band, while the final amplifier 14 in the second path 19 serves for the 800 MHz-1000 MHz frequency band. In order to use a common antenna network, the two paths 18, 19 are switched to a common output signal path 20 by a second inverse used frequency switch 1b which is arranged after the two final amplifiers 13, 14. During operation of one of the final amplifiers 13, 14, the other one can be turned-off by setting the corresponding supply voltage to zero, thus no power will be consumed by the not served frequency band. The inventive arrangement benefits the realisation of multiband/multistandard power amplifier modules for a very wide frequency range, among other things by common use of pre- and driver amplifier stages as well as improved matching of final amplifiers, resulting in improved output power, efficiency and gain characteristic.

Figure 4:
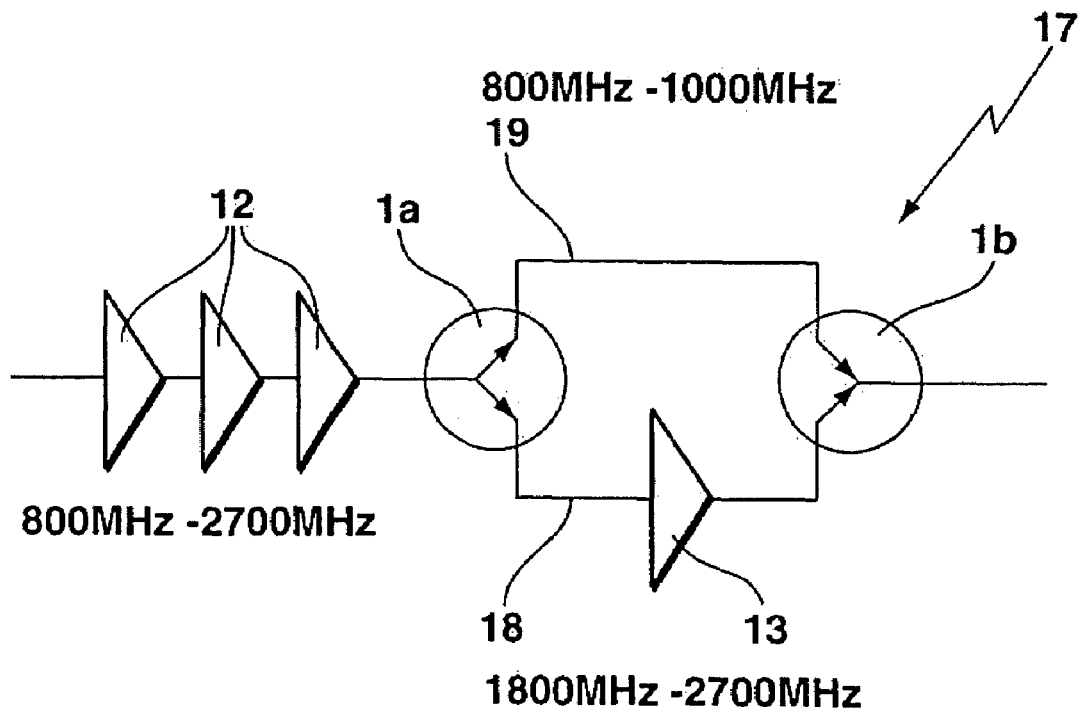
FIG. 4 shows a scheme of a second embodiment of an inventive multiband/multistandard power amplifier module used for stage by-passing.

FIG. 4 shows another field of application of the inventive frequency switch 1a within an amplifier module 17. The inventive frequency switch 1a is used for stage bypassing. This application is used for example for GSM/UMTS standards. While UMTS requires an additional final amplifier in order to provide the high required output power level due to high PAR of W-CDMA signals, GSM-signals can advantageously be transmitted without this final amplifying procedure. In FIG. 4 the first path 18 transfers UMTS-signals in the 1800 MHz-2700 MHz frequency band. The second path 19 transfers GSM-signals in the 800 MHz-1000 MHz frequency band. The inventive frequency switch allows transferring UMTS-signals to the first final amplifier 13 while GSM signals can be transferred directly to the second frequency switch 1b, therefore preventing further power loss. Therewith improvement of multiband/multistandard power amplifier module efficiency during GSM operation by bypassing the last amplifier stage (which is necessary for UMTS operation due to high peak-to-average ratio (PAR) of the WCDMA signal) is achieved.

It should be noted that the above described frequency bands are only exemplary. In principle any frequency range can be chosen.

Due to the fact that that components like pre- and driver amplifier stages, etc. can be used in common for both frequency bands, e.g. resulting in a saving of a complete driver chain compared to two necessary separate amplifier modules with an own driver amplifier chain, each, a main cost reduction can be achieved with the inventive multiband/multistandard power amplifier module. Additionally, an improvement of multiband/multistandard power amplifier module efficiency, output power and gain characteristic can be achieved, by optimized matching of the final amplifiers.

| Reference Signs | |
|---|---|
| 1, 1a, 1b | frequency switch |
| 2 | RF-block |
| 2a, 2b, 2c | RF-block in second output path |
| 2d | RF-block in first output path |
| 3 | capacitor |
| 3a, 3b, 3c | capacitor in second output path |
| 3d | capacitor in first output path |
| 4 | line section of quaterwave section |
| 4a, 4b, 4c | line sections of quaterwave sections in second output path |
| 4d | line section of quaterwave section in first output path |
| 5 | switching element |
| 5a, 5b, 5c | switching element in second output path |
| 5d | switching element in first output path |
| 6 | input port |
| 7 | first output port |
| 8 | first output path |
| 9 | second output port |
| 10 | second output path |
| 11 | Multiband/multistandard power amplifier module (first embodiment) |
| 12 | preamplifier stage |
| 13 | first final amplifier |
| 14 | second final amplifier |

-continued

| Reference Signs | |
|---|---|
| 15 | splitting node |
| 16a, 16b, 16c | further splitting node in second output path |
| 17 | Multiband/multistandard power amplifier module (second embodiment) |
| 18 | first path in multiband/multistandard power amplifier module |
| 19 | second path multiband/multistandard power amplifier module |
| 20 | common output signal path |

The invention claimed is:

1. A frequency switch for use in a multiband and/or multistandard power amplifier module, comprising:
at least two output ports, a first output port being arranged within a first output path and a second output port being arranged within a second output path, said output ports being connected with a common input port via said output paths, each output path being provided with at least one RF block, each RF-block including a capacitor, a switching element and a quarter-wave line section, whereby the capacitor is connected in series with the switching element and the quarter-wave line section, and the quarter-wave line section is connected in series with an output port, wherein for each RF-block a predetermined frequency band is selected and the length of said quarter-wave line section is matched to said selected frequency band in order to block incoming signals in said selected frequency band if the switching element of the corresponding RF-block is switched on.

2. The frequency switch according to claim 1, wherein during use of said switching element at least one RF-block of the frequency switch is switched off.

3. The frequency switch according to claim 1, further comprising at least one of the output paths having a plurality of the RF blocks each having a quarter-wave line section connected in series with a corresponding output port.

4. The frequency switch according to claim 1, wherein during use of said switching element all RF-blocks of the frequency switch are switched off.

5. A frequency switch for use in a multiband and/or multistandard power amplifier module, comprising:
at least two output ports, a first output port being arranged within a first output path and a second output port being arranged within a second output path, said output ports being connected with a common input port via said output paths, each output path being provided with at least one RF block, each RF-block including a capacitor, a switching element and a quarter-wave line section, whereby the capacitor is connected in series with the switching element and the quarter-wave line section, and the quarter-wave line section is connected in series with an output port, wherein for each RF-block a predetermined frequency band is selected and the length of said quarter-wave line section is matched to said selected frequency band in order to block incoming signals in said selected frequency band if the switching element of the corresponding RF-block is switched on and during use of said switching element all RF-blocks are switched off.

6. A multiband and/or multistandard power amplifier module comprising:
a preamplifier stage for preamplifying an incoming signal in the total bandwidth up to an intermediary level;
a frequency switch for blocking signals in at least one of the selected frequency bands including at least two output ports, a first output port being arranged within a first output path and a second output port being arranged within a second output path, said output ports being connected with an input port via said output paths, each output path being provided with at least one RF block, each RF-block including a capacitor, a switching element and a quarter-wave line section, wherein for each RF-block a predetermined frequency band is selected and the length of said quarter-wave line section is matched to said selected frequency band in order to block incoming signals in said selected frequency band if the switching element of the corresponding RF-block is switched on; and
a first final amplifier which is arranged after the frequency switch within a first path and is optimized to amplify signals which are blocked in the second output path of said frequency switch from said intermediary level up to an output level.

7. The multiband and/or multistandard power amplifier module according to claim 6, wherein a second final amplifier is provided, which is arranged after said frequency switch within a second path.

8. The multiband and/or multistandard power amplifier module according to claim 7, wherein said first final amplifier and said second final amplifier are optimized with respect to the different selected frequency bands and show different gain, power and efficiency characteristics.

9. The multiband and/or multistandard power amplifier module according to claim 8, wherein said first final amplifier is optimized with respect to frequencies from 1.8 GHz to 2.7 GHz and said second final amplifier is optimized with respect to frequencies from 0.8 GHz to 1.0 GHz.

10. The multiband and/or multistandard power amplifier module according to claim 6, wherein the number of final amplifiers is equal to the number of output ports of said frequency switch.

11. The multiband and/or multistandard power amplifier module according to claim 6, wherein the number of final amplifiers is less than the number of output ports of said frequency switch.

12. The multiband and/or multistandard power amplifier module according to claim 6, wherein a second frequency switch is provided in order to switch and/or combine signals from said at least two paths to a total output signal.

13. The multiband and/or multistandard power amplifier module according to claim 6, wherein each RF block includes a quarter-wave line section connected in series with an output port.

14. The multiband and/or multistandard power amplifier module according to claim 13, further comprising at least one of the output paths having a plurality of the RF blocks each having a quarter-wave line section connected in series with a corresponding output port.

* * * * *